United States Patent
Yoon

(10) Patent No.: US 11,474,544 B2
(45) Date of Patent: Oct. 18, 2022

(54) PRESSURE CONTROL SYSTEM FOR LIQUID-COOLED ELECTRONIC COMPONENT COOLING DEVICE

(71) Applicant: ZALMAN TECH CO., LTD., Anyang-si (KR)

(72) Inventor: Kuk Young Yoon, Seoul (KR)

(73) Assignee: ZALMAN TECH CO., LTD., Anyang-si (KR)

( * ) Notice: Subject to any disclaimer, the term of this patent is extended or adjusted under 35 U.S.C. 154(b) by 0 days.

(21) Appl. No.: 17/514,229

(22) Filed: Oct. 29, 2021

(65) Prior Publication Data
US 2022/0050482 A1    Feb. 17, 2022

Related U.S. Application Data

(63) Continuation of application No. PCT/KR2020/006357, filed on May 14, 2020.

(30) Foreign Application Priority Data

May 27, 2019  (KR) .......................... 10-2019-0061942

(51) Int. Cl.
*G05D 16/08*  (2006.01)
*H05K 7/20*   (2006.01)
(Continued)

(52) U.S. Cl.
CPC ......... *G05D 16/08* (2013.01); *H05K 7/20272* (2013.01); *F17C 2205/0332* (2013.01);
(Continued)

(58) Field of Classification Search
CPC  G05D 16/08; H05K 7/20272; F28D 1/05366; F28F 9/0231
(Continued)

(56) References Cited

U.S. PATENT DOCUMENTS

| 9,683,479 B2* | 6/2017 | Cha .......................... F01P 7/14 |
| 10,619,555 B2* | 4/2020 | Cha ........................ F16K 17/196 |
| 10,989,102 B2* | 4/2021 | Han ........................ F01P 11/028 |

FOREIGN PATENT DOCUMENTS

| JP | 1998-280958 A | 1/1997 |
| JP | 10-280958 A   | 10/1998 |

(Continued)

OTHER PUBLICATIONS

Decision to Grant dated Apr. 28, 2020 in counterpart Korean Patent Application No. 10-2019-0061942 (1 pages in English and 2 pages in Korean).

(Continued)

*Primary Examiner* — Joel M Attey
(74) *Attorney, Agent, or Firm* — NSIP Law

(57) ABSTRACT

A pressure control system for a liquid-cooled electronic component cooling device. A cooling device cools an electronic component through a refrigerant moving along a pipe. A radiator is mounted on one side of the cooling device to exchange heat with the refrigerant, and has a vent hole extending outwardly. A head has discharge holes communicating with a plurality of first hollows formed therein in an outer circumferential surface thereof with a driver hole provided in an upper surface thereof. A body is coupled to a bottom side of the head and has a second hollow communicating with the first hollows in a lengthwise direction. A pressure controller extends outward from a bottom of the body with an inner portion thereof communicating with the second hollow, and includes a coupler having threads on one side of an outer circumferential surface thereof to be screwed into the vent hole.

4 Claims, 6 Drawing Sheets

(51) Int. Cl.
   *F28F 9/02*     (2006.01)
   *F28D 1/053*    (2006.01)
(52) U.S. Cl.
   CPC .. *F25B 2600/2525* (2013.01); *F28D 1/05366*
                    (2013.01); *F28F 9/0231* (2013.01)
(58) Field of Classification Search
   USPC ........................................................ 165/80.4
   See application file for complete search history.

(56)             References Cited

FOREIGN PATENT DOCUMENTS

| | | |
|---|---|---|
| JP | 2016/169652 A | 9/2016 |
| JP | 2016-169652 A | 9/2016 |
| KR | 10-0802202 B1 | 2/2008 |
| KR | 10-2009-0051557 A | 5/2009 |
| KR | 10-2010-0016977 A | 2/2010 |
| KR | 10-2010-0132784 A | 12/2010 |

OTHER PUBLICATIONS

International Search Report dated Sep. 11, 2020 in counterpart International Patent Application No. PCT/KR2020/006357 (2 pages in English and 2 pages in Korean).

* cited by examiner

PRESSURE CONTROL SYSTEM FOR LIQUID-COOLED ELECTRONIC COMPONENT COOLING DEVICE

CROSS-REFERENCE TO RELATED APPLICATIONS

Pursuant to 35 USC 120 and 365(c), this application is a continuation of International Application No. PCT/KR2020/006357 filed on May 14, 2020, which claims the benefit under 35 USC 119(a) and 365(b) of Korean Patent Application No. 10-2019-0061942, filed on May 27, 2019 in the Korean Intellectual Property Office, the entire disclosure of which is incorporated herein by reference for all purposes.

BACKGROUND

1. Field

The present disclosure relates to a pressure control system for a liquid-cooled electronic component cooling device and, particularly a pressure control system for a cooling device having a pressure controller in order to solve a problem with outward leakage or evaporation of a refrigerant due to a rise in internal pressure of a radiator connected to the cooling device for cooling an electronic component in a computer.

2. Description

A liquid-cooled electronic component cooling device refers to a device by which a refrigerant inside a jacket mounted around/on an electronic component such as a CPU absorbs heat from the electronic component to cool the electronic component.

This cooling device is connected to a radiator in order to once again cool the refrigerant whose temperature is raised by absorbing the heat from the electronic component.

The radiator has a tank temporarily storing a refrigerant flowing into a case in which electronic components are housed through a pipe and then flows out of the case again, a heat-radiating tube that extends in a zigzag form or with multiple folds to secure a maximal surface area, and additionally at least one fan that is rotatably mounted around the heat-radiating tube. Due to this radiator, a temperature of the refrigerant flowing through the radiator can be lowered.

However, in many cases, in a process in which the refrigerant circulates through the radiator for an extended period of time, the refrigerant includes a gas that may be partly evaporated and generated by an increase in temperature, and an internal pressure of the radiator is unnecessarily raised while flowing into the radiator along with this gas. In this case, the heat-radiating tube may be torn or damaged. In addition, a connecting pipe connected to the case in which electronic components are housed is also subjected to expansion of a volume, and a connection state between the radiator and the cooler is released, and thus the refrigerant may leak out. Further, in this process, the refrigerant may have a negative influence on the electronic components. Moreover, if the refrigerant includes a fluorine component, there may be a concern that, should the problem of the refrigerant leaking occur, such a problem may have bad influence on a human body.

Referring to prior technology in the Republic of Korea, it is disclosed that a radiator of a cooling device for a computer, disclosed in Korean Utility Model No. 20-0346093, can reduce a depth to which a heat-radiating tube is inserted by improving cross sections of upper and lower tanks, and thus can reduce loads of a motor and a pump by suppressing generation of an eddy within the cooling water inside the upper and lower tanks, and increasing cooling efficiency.

However, according to this technology, internal pressure is adjusted while discharging gas generated inside the radiator while discharging the gas generated inside the radiator, and thereby a need to develop a novel and inventive pressure control system for a liquid-cooled electronic component cooling device capable of extending a lifespan and solving a problem such as refrigerant leakage, etc. is increasing.

BRIEF SUMMARY

The present disclosure has been devised to overcome the problems of the prior art, and is directed to providing a system having a pressure controller capable of discharging gas unnecessarily generated from a radiator connected with a cooling device, thereby stably maintaining an internal pressure of the radiator.

Another objective of the present disclosure is to prevent a problem in which gas is discharged along with a refrigerant by providing a zigzag-shaped passage inside a pressure controller.

Yet another objective of the present disclosure is to provide a filter inside a pressure controller to filter off harmful components included in a refrigerant to flow out along with gas.

Still another objective of the present disclosure is to include a porous medium and an endothermic capsule acting as components of a filter, thereby adsorbing harmful components and gases to prevent the same from being discharged, and further absorbing heat to further improve cooling efficiency of a cooling system.

Still another objective of the present disclosure is to inoculate an auxiliary filter with microorganisms, thereby enabling dissolution of harmful gases and components in an eco-friendly way and assisting filtering performance of the filter.

To achieve the objectives, a pressure control system for a liquid-cooled electronic component cooling device according to the present disclosure may include: a cooling device configured to cool an electronic component through a refrigerant moving along a pipe; a radiator mounted on one side of the cooling device to exchange heat with the refrigerant, and configured to include a vent hole extending outwardly from one side inside the radiator and on an inner circumferential surface on which threads are formed; a head having discharge holes communicating with a plurality of first hollows formed therein along a circumference of an outer circumferential surface thereof with a driver hole provided in an upper surface thereof; a body coupled to a bottom side of the head and having a second hollow communicating with the first hollows in a lengthwise direction; and a pressure controller configured to extend outward from a bottom of the body with an inner portion thereof communicating with the second hollow, and including a coupler having threads on one side of an outer circumferential surface thereof so as to be screwed into the vent hole.

Further, the body may have partitions formed at regular intervals in a height direction to partition the second hollow and disposed such that a zigzag passage is formed on the basis of the second hollow.

The pressure control system for a liquid-cooled electronic component cooling device according to the present disclosure has the following effects.

1) It is possible to naturally prevent a problem in which internal pressure is raised by gas unnecessarily generated inside a radiator, thereby securing safety of the system as well as preventing a refrigerant from leaking.

2) It is possible to prevent a gas and a refrigerant from leaking together due to a unique structure inside a pressure controller.

3) It is possible to prevent a refrigerant from leaking and discharge only a gas outwardly while filtering off harmful components in the gas or the refrigerant using a filter in a pressure controller.

4) It is possible to adsorb harmful components and gases through a filter to thereby prevent the same from being discharged outwardly, and to absorb heat to further improve cooling efficiency of a cooling system.

5) It is possible to dissolve harmful gases and components in an eco-friendly way through an auxiliary filter into which microorganisms are inoculated, and to assist filtering performance of the filter.

DETAILED DESCRIPTION

Figure 1:
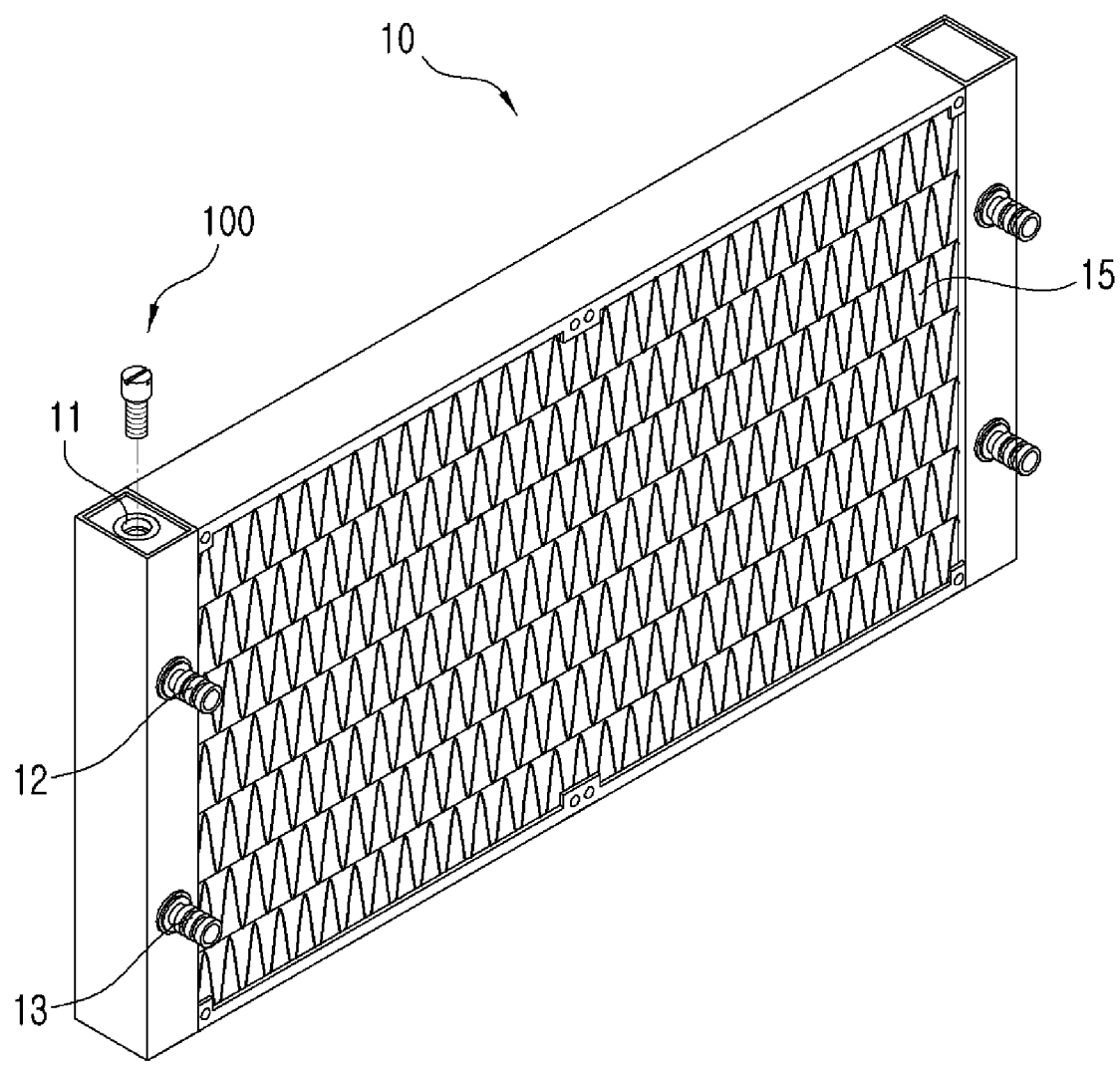
FIG. 1 is an exploded perspective view illustrating coupling of a pressure controller to a vent hole of a radiator.

Hereinafter, exemplary embodiments of the present disclosure will be described in detail with reference to the attached drawings. The attached drawings are not illustrated to scale, and the same or like reference numeral may be used to refer to the same or like elements throughout the drawings.

FIG. 1 is an exploded perspective view illustrating coupling of a pressure controller to a vent hole of a radiator.

First, a cooling device of the present disclosure provides a pump to cause a refrigerant to move along a pipe (not illustrated in the figure), and provides a function to enable the refrigerant to absorb heat of an electronic product by disposing the pipe to pass one side of an electronic part or causing the refrigerant to flow via a jacket attached to a surface of the electronic part. This configuration is equal to a configuration of a known water-cooled cooling device, and thus a separate concrete description thereof will be omitted.

Referring to FIG. 1, it can be seen that a vent hole 11 is formed on one side of a radiator 10, and that a pressure controller 100 is coupled to the vent hole 11. In this case, threads can be formed on an inner circumferential surface of the vent hole 11, and a compartment space capable of housing a body 120 and a coupler 130 (to be described below) of the pressure controller 100 with a diameter difference can be provided.

The radiator 10 of the present disclosure is mounted on one side of the cooling device, or forms one component of the cooling device, and provides a function of causing a refrigerant to be introduced through an inflow section 12 connected to the pipe of the cooling device, a function of causing the refrigerant to flow to a heat exchanger 15 that secures a sufficient surface area through multiple flexures, a function of driving a fan (not illustrated) to lower a temperature of the refrigerant and a function of moving the refrigerant whose temperature is lowered to the pipe of the cooling device so as to cool the electronic part again through a discharge section 13.

This radiator 10 also has no difference in terms of structure and functions from the previously described radiator of the cooling device, and thus an additional description thereof will be omitted.

Particularly, a region of the radiator 10 in which the vent hole 11 is concavely formed is adjacent to the inflow section 12 and the discharge section 13 to which the pipe of the cooling device is connected. Especially, a part of the refrigerant, introduced through the inflow section 12 in a state in which the temperature of the refrigerant is raised, is evaporated to generate a gas, and the generation of the gas is concentrated on a region in which the inflow section 12 is installed. For this reason, the vent hole 11 is preferably formed around the inflow section 12 in a concave state.

Figure 2:
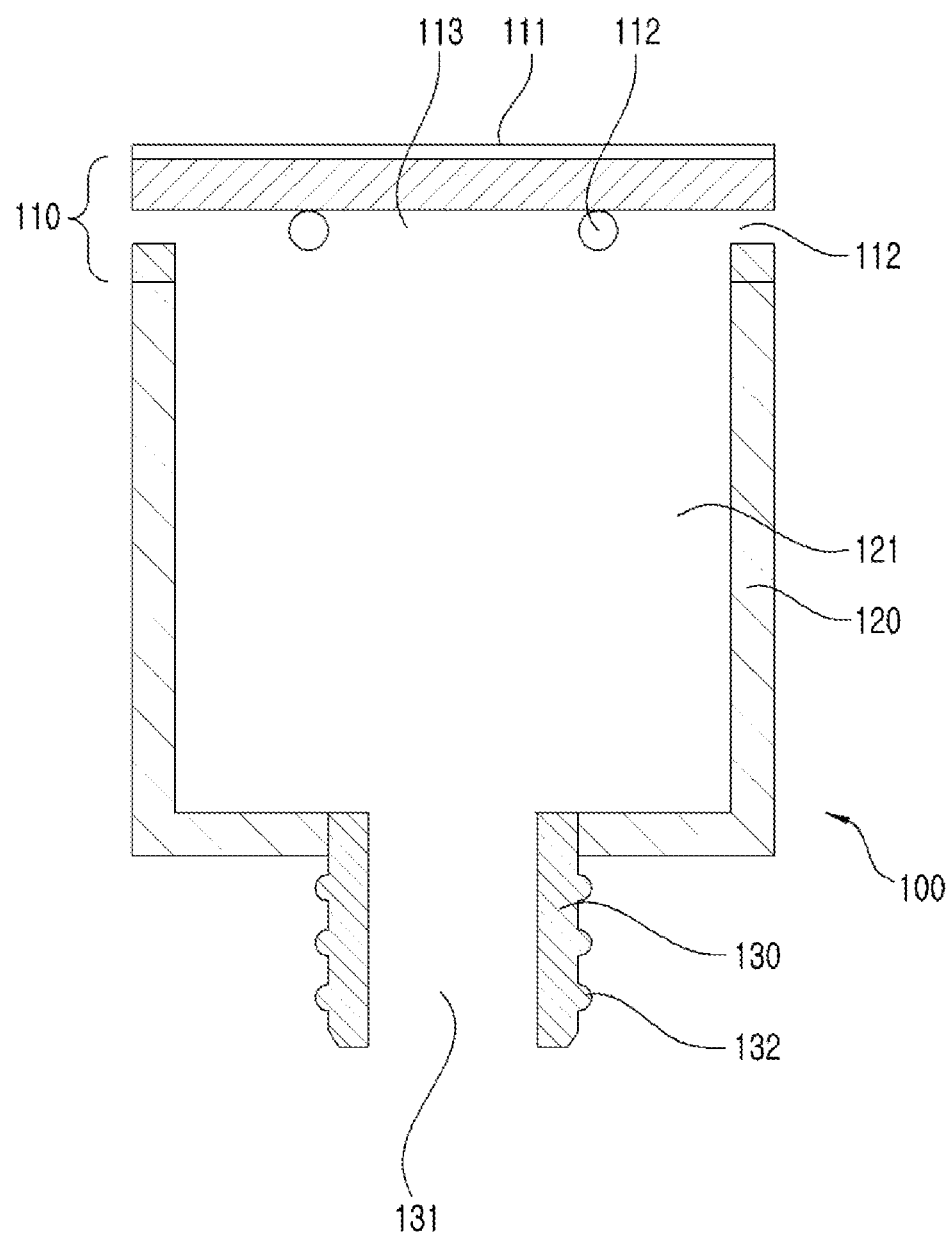
FIG. 2 is a cross-sectional view illustrating a basic structure of the pressure controller.

FIG. 2 is a cross-sectional view illustrating a basic structure of the pressure controller.

The pressure controller 100 of the present disclosure is inserted into the vent hole 11 of the above-mentioned radiator 10, and performs a function of outwardly discharging the gas in the radiator 10 via the vent hole 11 of the radiator 10.

As can be seen from FIG. 2, the pressure controller 100 of the present disclosure has an assembly including a head 110, a body 120, and a coupler 130 in a state in which it is formed in a cylindrical shape on the whole.

The head 110 forms an upper region of the pressure controller 120, and has a cylindrical structure whose upper surface is closed and whose bottom side is open.

Referring to FIG. 1, a driver hole 111 is concavely formed in an upper surface of the head 110 such that the pressure controller 100 is easily fastened to the vent hole 11 through a driver.

An inner portion of the head 110, i.e. a lower inner portion of the upper surface of the head 110, is formed in an empty space, known as a first hollow 113. The first hollow 113 communicates with second and third hollows 121 and 131 (to be described below) in a height direction. In addition, a plurality of discharge holes 112 are formed along a circumference of the head 110 to pass through an outer circumferential surface of the head 110, and communicate with the first hollow 113.

The body 120 forms an intermediate region of the pressure controller 100 in a cylindrical structure coupled to a bottom side of the head 110. This body 120 takes a structure in which an upper surface side thereof is open, and a bottom surface thereof is blocked on the remaining region excepting a through-hole of a central region thereof. Accordingly, a space is naturally formed in the body, and is known as a second hollow 121. The second hollow 121 communicates with the first hollow 113 located on an upper side, and a third hollow 131 located on a lower side. A volume of the second hole 121 among the plurality of hollows is largest.

The coupler 130 extends downwardly from the bottom surface of the body with a diameter corresponding to a diameter of the through-hole of the body 120, and is formed in a structure such as a pipe whose opposite sides are open. However, threads 132 are formed on an outer circumferential surface of the coupler 130, and can be screwed along with the threads of the vent hole 111.

According to this structure, a user can couple and decouple the pressure controller 100 to and from the vent hole 11 by forwardly and backwardly turning a driver with the driver fastened to the driver hole 111. When the pressure controller 100 is inserted into and coupled to the vent hole 11, an upper region of the pressure controller 100 in which the discharge holes 112 are formed such that the discharge holes 112 of the head 110 are not covered by the vent hole 11 maintains an exposed state without being inserted into the vent hole 11.

The pressure controller 100 provides a guide role of raising the gas in the radiator 10 in directions of the third hollow 131, the second hollow 121, and the first hollow 113. In this case, the pressure controller 100 is designed such that, if the upper surface of the head 110 is open, the gas and the refrigerant of the radiator 10 can be raised together and be discharged outwardly, and thus the gas can be discharged to be easier than the liquid through the plurality of discharge holes 112 penetrating in a region around a lower side of the head 110 in a state in which the upper surface of the head 110 is airtightly closed.

Therefore, the pressure controller 100 provides a characteristic in that the internal pressure of the radiator 10 can be controlled and prevented from being unnecessarily raised by outwardly discharging the gas in the radiator 10 through the discharge holes 112 on the basis of the above-mentioned action.

Figure 3:
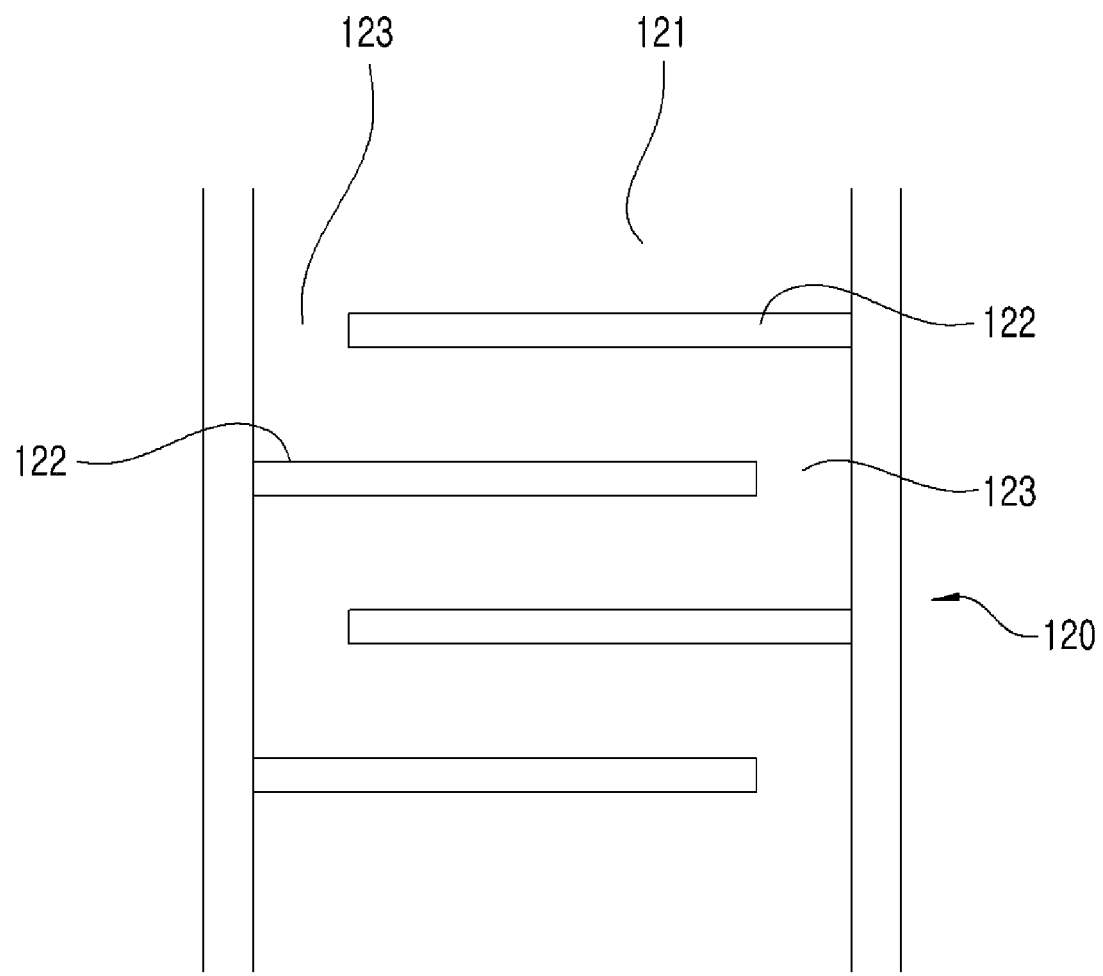
FIG. 3 is a cross-sectional view illustrating a state in which partitions are formed in a body of the pressure controller.

FIG. 3 is a cross-sectional view illustrating a state in which partitions are formed in a body of the pressure controller.

Referring to FIG. 3, it can be seen that a plurality of partitions 122 are formed in the second hollow 121 of the body 120 at regular intervals in a height direction of the second hollow 121. Particularly, the partitions 122 are partly opened to form the passages 123 through which the gas can pass through a region of the installed second hollow 121. When observing the plurality of partitions 122, the passages 123 are not formed in a straight line but in a zigzag shape so as to cross each other on the basis of the second hollow 121.

This provides a function of more efficiently preventing a gas evaporated from the refrigerant inside the radiator 10 as well as a liquid liquefied by cooling of a part of the gas from being raised to flow outwardly along with the gas. Especially, in a case in which the refrigerant includes a component such as a fluorine component harmful to a human body, leaking outwardly may be fatal. A plurality of spaces partitioned by the partitions 122 are formed in a zigzag line, thereby allowing the liquid to remain in the partitions 122 and allowing the remaining liquid to again fall down along passages by gravity. In this way, to help the falling in a gravitational direction of the liquid, the partitions 122 can be formed to extend to be slanted with each passage 123 at a starting point on the basis of each passage 123.

Figure 4:
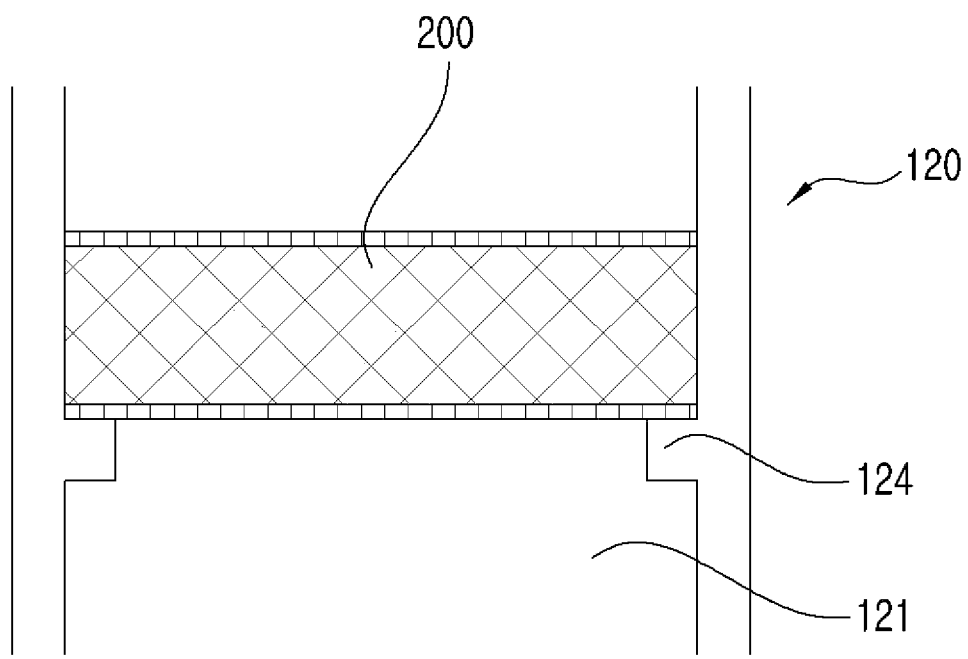
FIG. 4 is a cross-sectional view illustrating a state in which a filter is mounted in the body of the pressure controller.
Figure 5:
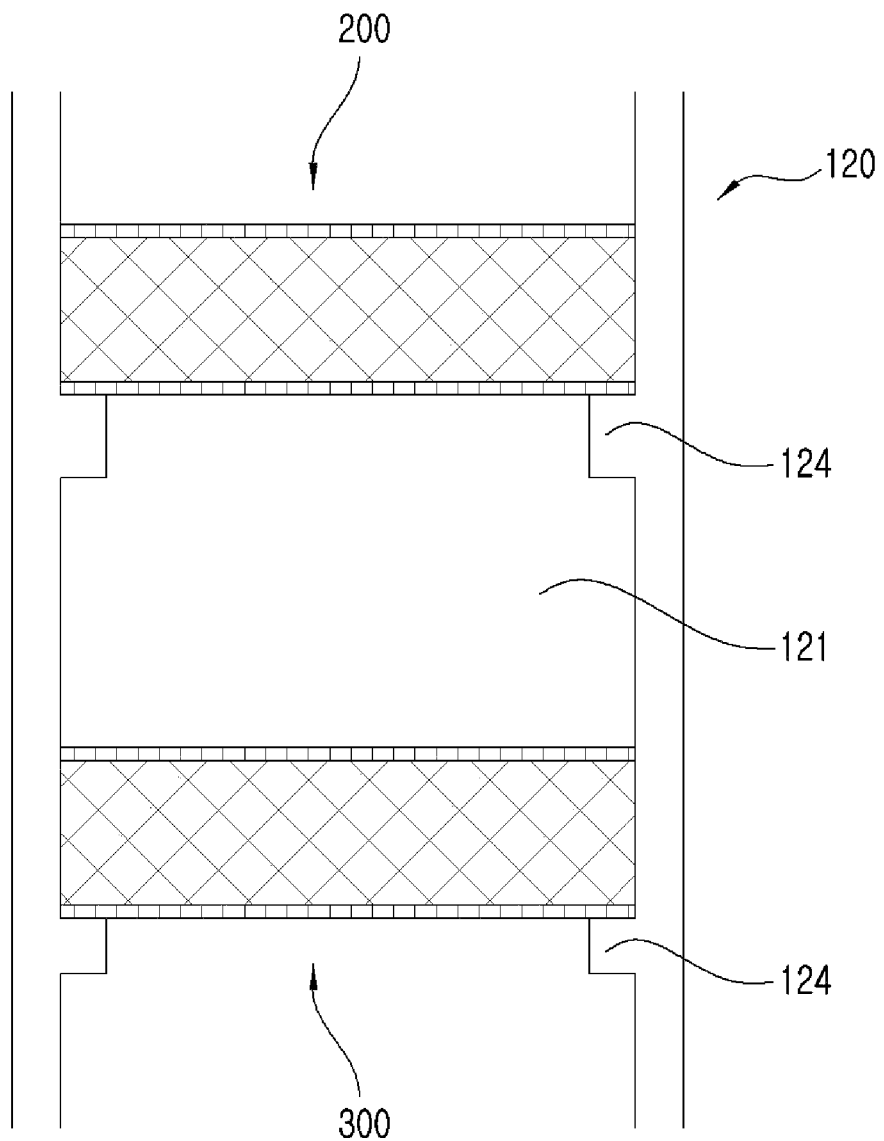
FIG. 5 is a cross-sectional view illustrating a state in which a filter and an auxiliary filter are mounted in the body of the pressure controller.

FIG. 4 is a cross-sectional view illustrating a state in which a filter is mounted in the body of the pressure controller, and FIG. 5 is a cross-sectional view illustrating a state in which a filter and an auxiliary filter are mounted in the body of the pressure controller.

The filter 200 may be additionally housed in the second hollow 121 of the body 120. This filter 200 is formed in a porous structure in which a gas can be circulated, and porous membranes may be layered on opposite sides of the filter that is also formed of a porous material. Since this structure is the same as a well-known filter, separate concrete description thereof will be omitted.

The filter 200 serves to filter off harmful components of the gas or foreign materials, and simultaneously performs a basic role of preventing the liquid-phase refrigerant raised along with the gas from leaking outwardly.

A method of manufacturing the pressure controller according to this may include a step of mounting a filter in a second hollow of the body and a step of coupling the body to the head and the coupler.

In this case, the filter is manufactured including a porous medium, and external diffusion of the refrigerant including fluorine capable of having a bad influence on health of a human body and an environment and the gas generated through the refrigerant can be prevented. In this case, the filter can be basically manufactured by applying a filter composition to a fabric of the filter which is generally used, such as an unwoven fabric.

Figure 6:
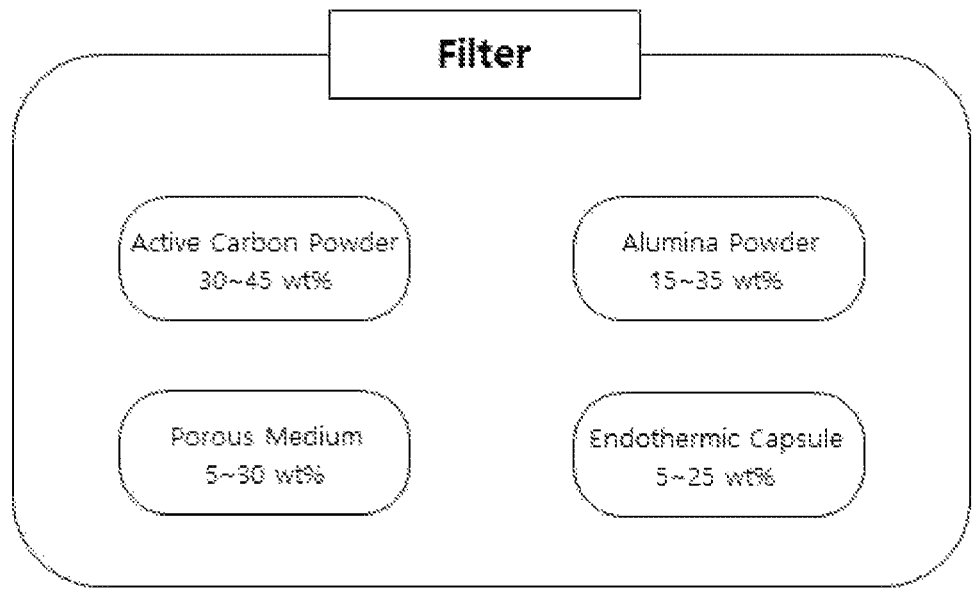
FIG. 6 is a conceptual view illustrating compositions of the filter and the auxiliary filter of the present disclosure.
Figure 6:
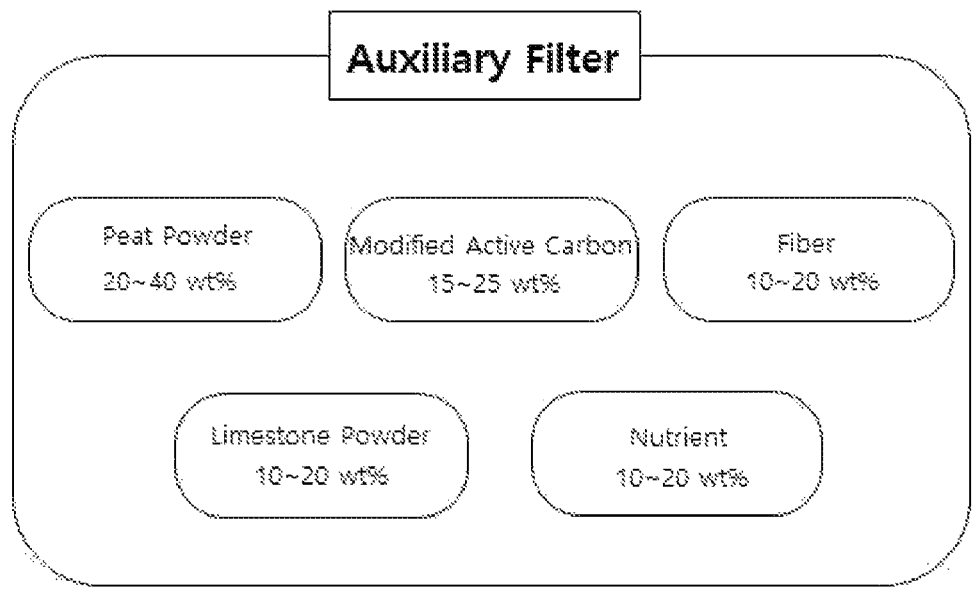

FIG. 6 is a conceptual view illustrating compositions of the filter and the auxiliary filter of the present disclosure.

In this case, the filter may be formed of a mixture of 30 to 45 wt % of active carbon powder, 15 to 35 wt % of alumina powder, 5 to 30 wt % of porous medium including polyacrylonitrile, and 5 to 25 wt % of an endothermic capsule. In this case, a mixing percentage of the above-mentioned auxiliary filter concretely refers to that of a filler filled in the auxiliary filter. That is, the filler having the above-mentioned mixing percentage is applied to a fabric of a general filter such as an unwoven fabric, thereby becoming an auxiliary filter. An exact numerical value of a size of the filter is not restricted. Further, a shape of this filter may be a form in which one or multiple filters having a shape of a thin sheet are overlapped, and is not separately limited.

Here, the active carbon serves as an adsorbent that has a strong adsorptive property to generally absorb a gas or moisture and is included as a component of the filter to adsorb harmful components and gases, and thereby can prevent external discharge thereof. Further, the alumina ($Al_2O_3$) is an aluminum oxide having excellent thermal resistance and excellent strength, has a strong adsorptive property due to a large surface area, and can serve to prevent external outflow of gases including a Freon gas along with the active carbon. In addition, the porous medium is manufactured including polyacrylonitrile, and can function to effectively prevent external outflow of the harmful gases because many fine holes are also formed in a surface of the porous medium. A concrete producing method will be described below. Finally, the endothermic capsule is produced including hexadecane, can function to absorb heat, and is helpful to function as the cooling device, and a concrete producing method thereof will be described through processes to be described below.

At this time, the above-mentioned porous medium is a fiber that is produced including polyacrylonitrile, is a material having excellent adsorptive performance due to many fine holes, and can be produced by way of the following steps including a primary solution producing step, a secondary solution producing step, a sub-material producing step, and a drying step.

First, the primary solution producing step is a process of producing a primary solution by mixing 70 to 85 wt % of dimethylformamide (DMF), and 15 to 30 wt % of hydroxyapatite on the basis of the overall weight of the primary solution, and performing ultrasonic treatment on the primary solution for 5 to 15 minutes, and the secondary solution producing step is a process of producing a secondary solution by mixing 60 to 75 wt % of the primary solution, 10 to 25 wt % of polyacrylonitrile, and 10 to 25 wt % of polyvinylpyrrolidone on the basis of the overall weight of the secondary solution, and heating the secondary solution at a temperature of 50 to 70° C. for 1 to 3 hours.

Here, the DMF serves as an organic solvent of the primary solution and the secondary solution, hydroxyapatite is a mineral generated in nature, and is a material that is excellent in terms of durability and mechanical strength and has porosity, the polyacrylonitrile is a material that is mainly used as an acryl-based synthetic fiber as a vinyl polymer obtained by performing radical polymerization on acrylonitrile, and the polyvinylpyrrolidone is a material that acts as a polymer of vinylpyrrolidone, has hygroscopicity, and can alleviate toxicity of toxic materials and bacteria due to a detoxifying action.

The hydroxyapatite, the polyacrylonitrile, and the polyvinylpyrrolidone are polymerized by a heating process, and can be prepared to be spun in a shape of a thin fiber through a process to be described below. Further, it is preferable that the hydroxyapatite can be uniformly dispersed in the DMF that is the solvent through an ultrasonic treating process, and that a heating process is proceeded by heating in boiling water rather than direct heating.

Afterwards, the sub-material producing step is a process of compressing the secondary material at a speed of 10 to 30 mm/min with strength of 2 to 4 KN and then spinning it at a thickness of 0.5 to 1.0 mm. Through this process, a sub-material is spun in a shape of a thin fiber, and is spun under conditions of the above-mentioned speed and pressure. This is helpful to form a function and a preferred mechanical strength of a porous form to be finished.

Finally, the drying step is a process of immersing the sub-material for a time of 20 to 30 hours, and then drying the sub-material at a temperature of 40 to 60° C. for a time of 20 to 30 hours. Here, through the process of immersing the sub-material in water, many fine holes may be formed in the surface of the porous medium.

The porous medium produced through this process is included as the component of the filter, and can be helped to improve an ability to adsorb the harmful gases of the filter. Because the porous medium has a shape of the fiber, it is possible to improve durability of the filter and to be helped to extend a life time of the filter.

Further, because the endothermic capsule, a component of the filter, can perform a function capable of effectively absorbing generated heat, it is helpful to improve cooling efficiency of the cooling system of the present disclosure. This endothermic capsule can be produced by way of the primary solution producing step, the secondary solution producing step, and the endothermic capsule finishing step.

First, the primary solution producing step is a process of mixing 55 to 75 wt % of cyclohexane, 5 to 10 wt % of polyethylene glycol (PEG), 5 to 10 wt % of hexadecane, and 15 to 30 wt % of toluene-2,4-diisocyanate (TDI) on the basis of the overall weight of the first solution and producing the first solution.

Here, the TDI performs a role as a monomer that can form a shell of the endothermic capsule that has a form of a microcapsule, and the polyethylene glycol and the hexadecane have high latent heat as core materials to be located inside an endothermic agent, and can further improve cooling efficiency by accumulating internal heat. Further, the cyclohexane performs a role as an organic solvent of the first solution.

Next, the secondary solution producing step is a process of mixing 80 to 95 wt % of water and 5 to 20 wt % of surfactant on the basis of the overall weight of the secondary solution, and producing a secondary solution.

Here, as the surfactant, anon-ionic based surfactant can be used, and Triton X-100 or the like can be used. This surfactant can generate an interface polymerization phenomenon to produce a shape of the microcapsule.

Finally, the endothermic capsule finishing step is a process of mixing 40 to 60 wt % of the primary solution, 35 to 55 wt % of the secondary solution, and 1 to 10 wt % of diethylene-triamine on the basis of the overall weight of the endothermic capsule, and heating them for 70 to 100 minutes at a temperature of 50 to 70° C. Here, the diethylene-triamine performs a role as a catalyst that accelerates a speed at which the endothermic capsule is finished.

The endothermic capsule produced through this process can be stably stored for a long period of time because a material acting to absorb heat in a form of a microcapsule is accumulated on a capsule wall, and can further improve cooling efficiency of the cooling system because the material is applied to the filter and absorbs heat.

In addition, the body may further provide an auxiliary filter in addition to the above-mentioned filter. In this case, the auxiliary filter may be disposed in a second hollow with a height difference with the above-mentioned filter. In this case, the auxiliary filter exists on a side below the above-mentioned filter to primarily filter the refrigerant and the gases before the above-mentioned filter acts, so that the auxiliary filter can further improve filtering performance and proceed the filtering through microorganisms in an eco-friendly way as a bio-filter inoculated with the microorganisms and nutrients. A detailed configuration of this auxiliary filter will be described below.

At this time, the auxiliary filter is formed of a mixture of 20 to 40 wt % of peat powder, 15 to 25 wt % of modified active carbon, 10 to 20 wt % of fiber, 10 to 20 wt % of limestone powder, and 10 to 20 wt % of nutrient, and the microorganisms may be inoculated on the mixture.

In this case, a mixing percentage of the above-mentioned auxiliary filter refers to that of a filler filled in the auxiliary filter. Like the afore-mentioned filter, a filler having the afore-mentioned mixing percentage is applied to a fabric of a general filter such as an unwoven fabric, thereby becoming an auxiliary filter. An exact numerical value of a size of the filter is not restricted.

Here, peat is a kind of coal and is a material that performs a damping function between the filters to prevent losses of the microorganisms and the other components, and the modified active carbon acts as a porous material and adsorbs the harmful components and gases to thereby prevent discharge outwardly, serves as a bulking agent capable of solving a blocking phenomenon and a consolidation phenomenon during operation of the bio-filter. A concrete method of producing the modified active carbon will be described below. Further, like the active carbon powder, the fiber serves as the bulking agent for preventing a consolidation phenomenon and enhancing durability. The limestone powder functions as a buffer for preventing a sharp pH change inside the auxiliary filter. In addition, the nutrients are for activity maintenance and growth of microorganisms, and may include nitrogen, phosphor, sulfur, calcium, magnesium, iron, etc. that are important nutrients in the process for growth and metabolism of the microorganisms. As the microorganisms, *Pseudomonas* sp., *Thiobacillus* sp., *Nitrosomonas* sp., and *Bacillus* sp. may be used. These microorganisms are filled in the auxiliary filter, and may decompose harmful gases and materials into eco-friendly materials. Further, a process of covering the auxiliary filter with the filler can be advanced through a supporting process and a directly applying process, and is not limited.

In addition, a method of producing the pressure controller may include a step of mounting the auxiliary filter in the second hollow of the body, and a step of coupling the body to the head and the coupler. At this time, the modified active carbon of the auxiliary filter is a material in which a surface of the active carbon is modified and a capability to adsorb particles of harmful gases including a fluorine gas is further improved, and may be produced by a step of producing active carbon powder, a step of producing an intermediate solution, and a step of finishing the modified active carbon.

First, the step of producing active carbon powder includes a process of pulverizing and washing active carbon, and a process of drying the washed active carbon powder at a temperature of 90 to 120° C. for a time of 12 to 36 hours. At this time, the washing process is preferably performed once to five times using water, and the active carbon powder is preferably pulverized to have a size of about 8×16 mesh. This is not necessarily limited by the above-mentioned numerical number.

Next, the step of producing an intermediate solution includes a process of mixing 50 to 65 wt % of active carbon powder, 15 to 30 wt % of 2 M $Fe(NO_3)3X9H_2O(Fe(NO_3)3X9H_2O)$, and 5 to 20 wt % of 10 M sodium hydroxide on the basis of the overall weight of the intermediate solution. In this case, when $Fe(NO_3)3X9H_2O(Fe(NO_3)3X9H_2O)$ and sodium hydroxide are mixed to become an iron catalyst. The iron catalyst is adhered to surfaces of particles of the active carbon powder, and can further improve a capability to adsorb particles of harmful gases including a fluorine gas of the active carbon powder.

Finally, the step of finishing the modified active carbon includes a process of filtering the intermediate solution, and a process of washing and drying a residue. In this case, the modified active carbon is included in the residue after the filtering process. The washing process is preferably performed 1 to 5 times using water. Further, the drying process is preferably performed at a temperature of 100 to 200° C. for a time of 12 to 36 hours. This drying process is performed to remove moisture left by the washing process, and simultaneously to stabilize the iron catalyst adhered to the surface of the modified active carbon.

The modified active carbon produced in this process is to adhere an iron catalyst to an existing active carbon, to exhibit excellent adsorbing ability and effectively prevent external discharge of particles of other harmful materials or gases including a fluorine gas.

As described hereinbefore, the configuration and operation of the pressure control system for a liquid-cooled electronic component cooling device according to the present disclosure are expressed in the description and drawings, but are merely provided by way of example. The scope of the present disclosure is not limited to the description and drawings, and can be variously changed and modified without departing from the technical idea of the present disclosure.

| Description of Reference Numerals of Drawings | |
|---|---|
| 10: radiator | 11: vent hole |
| 12: inflow section | 13: discharge section |
| 15: heat exchanger | 100: pressure controller |
| 110: head | 111: driver hole |
| 112: discharge hole | 113: first hollow |
| 120: body | 121: second hollow |
| 122: partition | 123: passage |
| 124: stepped portion | 130: coupler |
| 131: third hollow | 132: thread |
| 200: filter | 300: auxiliary filter |

What is claimed is:

1. A pressure control system for a liquid-cooled electronic component cooling device comprising:
    a head comprising a first hollow formed therein, a plurality of discharge holes formed along a circumference of an outer circumferential surface of the head and communicating with the first hollow; and
    a body coupled to a bottom side of the head and comprising a second hollow communicating with the first hollow in a lengthwise direction of the body and threads disposed on one side of an outer circumferential surface of the body,
    wherein the body comprises a plurality of partitions disposed at regular intervals in the lengthwise direction of the body to partition the second hollow that a zigzag passage is formed in the second hollow, and
    wherein the body has a filter with a porous medium including polyacrylonitrile and spanning the second hollow.

2. The pressure control system according to claim 1, wherein the body comprises an auxiliary filter including modified active carbon and disposed in the second hollow with a height difference from the filter.

3. The pressure control system according to claim 1, wherein the filter is formed of a mixture of 30 to 45 wt % of active carbon powder, 15 to 35 wt % of alumina powder, 5 to 30 wt % of a porous medium including polyacrylonitrile, and 5 to 25 wt % of endothermic capsule including hexadecane.

4. The pressure control system according to claim 2, wherein the auxiliary filter is formed of a mixture of 20 to 40 wt % of peat powder, 15 to 25 wt % of modified active carbon, 10 to 20 wt % of fiber, 10 to 20 wt % of limestone powder, 10 to 20 wt % of nutrient, and microorganisms.

* * * * *